United States Patent
Wu et al.

(10) Patent No.: US 8,115,756 B2
(45) Date of Patent: Feb. 14, 2012

(54) DISPLAY DRIVER INTEGRATED CIRCUIT USING PING-PONG TYPE SAMPLE AND HOLD CIRCUIT

(75) Inventors: Zhong-yuan Wu, Suwon-si (KR); Hyoung-rae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 454 days.

(21) Appl. No.: 12/380,941

(22) Filed: Mar. 5, 2009

(65) Prior Publication Data

US 2009/0237386 A1 Sep. 24, 2009

(30) Foreign Application Priority Data

Mar. 18, 2008 (KR) .................. 10-2008-0024891

(51) Int. Cl.
*G06F 3/038* (2006.01)
(52) U.S. Cl. .......................................... 345/211; 345/99
(58) Field of Classification Search ........................ None
See application file for complete search history.

(56) References Cited

U.S. PATENT DOCUMENTS

| | | | | |
|---|---|---|---|---|
| 6,384,817 | B1 * | 5/2002 | Janssen et al. | 345/204 |
| 7,110,009 | B2 * | 9/2006 | Ooishi et al. | 345/690 |
| 7,259,742 | B2 * | 8/2007 | Chang et al. | 345/98 |
| 2004/0263540 | A1 * | 12/2004 | Ooishi et al. | 345/690 |
| 2005/0007334 | A1 | 1/2005 | Park | |
| 2005/0285822 | A1 * | 12/2005 | Reddy et al. | 345/76 |

FOREIGN PATENT DOCUMENTS

| | | |
|---|---|---|
| JP | 5-297833 | 11/1993 |
| JP | 2004-264461 | 9/2004 |
| KR | 10-0595312 A | 6/2006 |

OTHER PUBLICATIONS

JP 05-297833 English Translation Dec. 11, 1993 Isogai Hiroyuki.*

* cited by examiner

*Primary Examiner* — Van Chow
(74) *Attorney, Agent, or Firm* — Onello & Mello, LLP (57) ABSTRACT

A display driver integrated circuit using a ping-pong type sample and hold circuit is provided. The display driver integrated circuit includes a data counter, a comparison unit, a gray voltage generation unit, and a sample and hold circuit. The data counter outputs first through n-th gamma data in response to a clock signal. The comparison unit compares input image data with each of the first through n-th gamma data so as to output a comparison signal. The gray voltage generation unit generates first through n-th gray voltages in response to the first through n-th gamma data. The sample and hold circuit includes a first sub sample and hold circuit and a second sub sample and hold circuit and outputs one of the first through n-th gray voltages in response to the comparison signal. While the first sub sample and hold circuit is performing sampling, the second sub sample and hold circuit outputs one of the first through n-th gray voltages, or alternatively, while the second sub sample and hold circuit is performing sampling, the first sub sample and hold circuit outputs one of the first through n-th gray voltages.

20 Claims, 10 Drawing Sheets

DISPLAY DRIVER INTEGRATED CIRCUIT USING PING-PONG TYPE SAMPLE AND HOLD CIRCUIT

CROSS-REFERENCE TO RELATED PATENT APPLICATION

This application claims the benefit of Korean Patent Application No. 10-2008-0024891, filed on Mar. 18, 2008, in the Korean Intellectual Property Office, the contents of which are incorporated herein in their entirety by reference.

BACKGROUND

1. Field of the Invention

The present invention relates to a display driver integrated circuit, and more particularly, to a display driver integrated circuit using a ping-pong type sample/hold circuit.

2. Description of the Related Art

In liquid crystal displays (LCDs), a panel is driven by applying a predetermined gray voltage to both ends of the panel. The gray voltage denotes a voltage determined according to a gamma curve, and is thus referred to as a gamma voltage.

A gray voltage depends on a gamma curve which is applied to a corresponding LCD (more specifically, to an LCD panel included in the LCD). Different gamma curves are applied according to LCD panel manufacturing methods, LCD panel manufacturing companies, etc. In addition, a gamma curve exhibits non-linearity characteristics.

Figure 1:
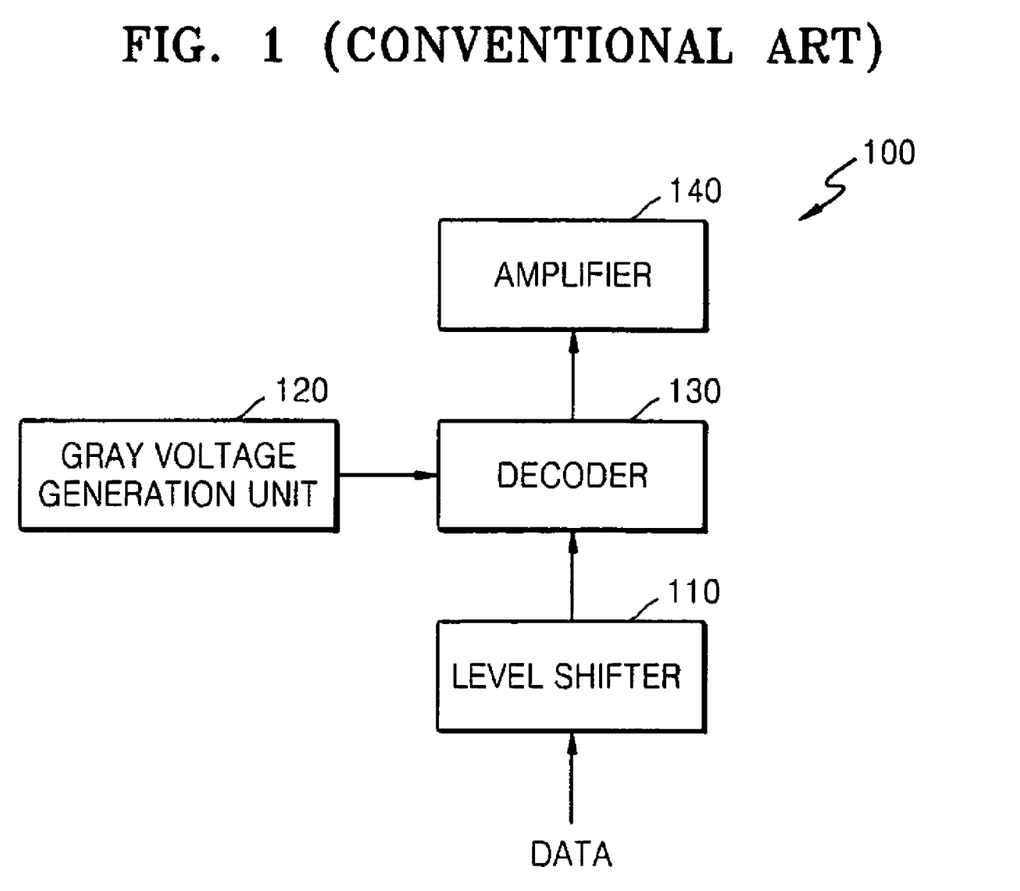
FIG. 1 is a block diagram of a conventional display driver integrated circuit.

FIG. 1 is a block diagram of a conventional display driver integrated circuit 100. Referring to FIG. 1, the conventional display driver integrated circuit 100 includes a level shifter 110, a gray voltage generation unit 120, a decoder 130, and an amplifier 140. The level shifter 110 receives input image data DATA from an external source, changes the level of the input image data DATA to an appropriate voltage level, and outputs a result of the level change to the decoder 130. The gray voltage generation unit 120 generates a plurality of gray voltages and outputs the gray voltages to the decoder 130. The decoder 130 selects one of the gray voltages in response to the input image data DATA and outputs the selected gray voltage to the amplifier 140. The amplifier 140 amplifies the gray voltage output by the decoder 130, and outputs the amplified gray voltage to an LCD panel (not shown).

Figure 2A:
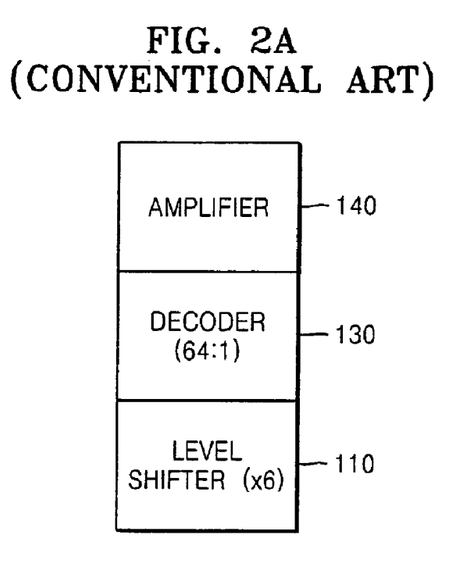
FIG. 2A is a block diagram of an area of the conventional display driver integrated circuit illustrated in FIG. 1 when 6-bit input image data is input.
Figure 2B:
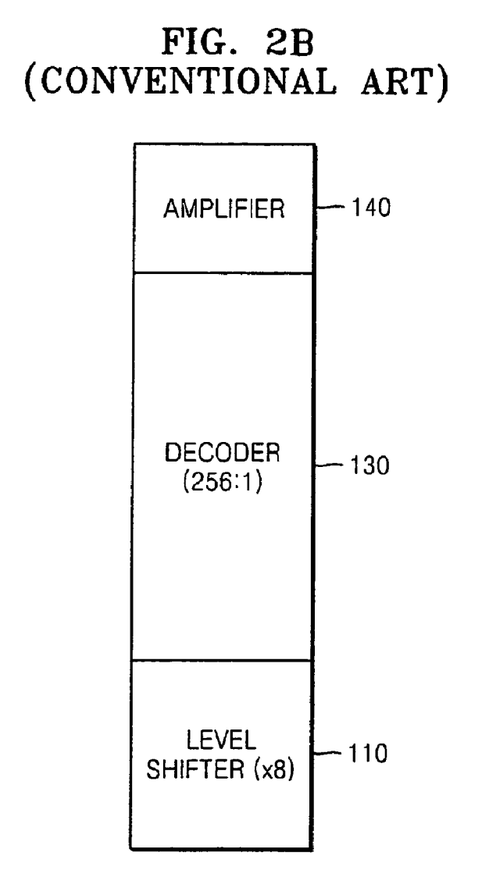
FIG. 2B is a block diagram of an area of the conventional display driver integrated circuit illustrated in FIG. 1 when 8-bit input image data is input.

FIG. 2A is a block diagram of an area of the conventional display driver integrated circuit 100 of FIG. 1 when 6-bit input image data is input. FIG. 2B is a block diagram of an area of the conventional display driver integrated circuit 100 of FIG. 1 when 8-bit input image data is input.

Referring to FIGS. 2A and 2B, an area of the decoder 130 is greater when the 8-bit input image data is input than when the 6-bit input image data is input. That is, in the conventional art, the higher the number of bits of the input image data is, the greater the size of the decoder 130 becomes by geometric progression. Thus, as the number of bits of the input image data increases, the conventional display driver integrated circuit 100 increases in size.

SUMMARY

The present invention provides a display driver integrated circuit which can minimize an increase in the area of the display driver integrated circuit and secure a sufficient sampling time by using a ping-pong type sample and hold circuit.

According to an aspect of the present invention, there is provided a display driver integrated circuit, which includes a data counter, a comparison unit, a gray voltage generation unit, and a sample and hold circuit. The data counter outputs first through n-th gamma data in response to a clock signal. The comparison unit compares input image data with each of the first through n-th gamma data so as to output a comparison signal. The gray voltage generation unit generates first through n-th gray voltages in response to the first through n-th gamma data. The sample and hold circuit comprises a first sub sample and hold circuit and a second sub sample and hold circuit and outputs one of the first through n-th gray voltages in response to the comparison signal. While the first sub sample and hold circuit is performing sampling, the second sub sample and hold circuit outputs one of the first through n-th gray voltages, or while the second sub sample and hold circuit is performing sampling, the first sub sample and hold circuit outputs one of the first through n-th gray voltages.

The first sub sample and hold circuit may comprise a first capacitor which is charged to an i-th gray voltage (where i is a natural number in the range of 1 to n), and the second sub sample and hold circuit may comprise a second capacitor which is charged to a j-th gray voltage (where j is a natural number in the range of 1 to n).

While the first capacitor is charged to the i-th gray voltage, the sample and hold circuit may output the j-th gray voltage of the second capacitor. The first capacitor may include a first terminal to which the i-th gray voltage is applied and a second terminal to which a reference voltage is applied. The second capacitor may include a first terminal to which an output terminal of the display driver integrated circuit is connected and a second terminal to which the reference voltage is applied.

While the second capacitor is charged to the j-th gray voltage, the sample and hold circuit may output the i-th gray voltage of the first capacitor. The second capacitor may include a first terminal to which the j-th gray voltage is applied and a second terminal to which a reference voltage is applied. The first capacitor may include a first terminal to which an output terminal of the display driver integrated circuit is connected and a second terminal to which the reference voltage is applied.

The display driver integrated circuit may further include an amplifier amplifying and outputting the gray voltage output by the sample and hold circuit.

The first sub sample and hold circuit may further comprise a first switching unit controlling a connection or disconnection of one of an output terminal of the gray voltage generation unit and an output terminal of the amplifier to a first terminal of the first capacitor and controlling a connection or disconnection of one of a first input terminal and a second input terminal of the amplifier to a second terminal of the first capacitor. The second sub sample and hold circuit may further comprise a second switching unit controlling a connection or disconnection of one of the output terminal of the gray voltage generation unit and the output terminal of the amplifier to a first terminal of the second capacitor and controlling a connection or disconnection of one of the first input terminal and the second input terminal of the amplifier to a second terminal of the second capacitor.

The first switching unit and the second switching unit may control the first terminals of the first and second capacitors to be disconnected from each other, and may control the second terminals of the first and second capacitors to be disconnected from each other.

The first switching unit may comprise: a first switch controlling a connection or disconnection of the first input terminal of the amplifier to the second terminal of the first capacitor in response to a first control signal; a second switch controlling a connection or disconnection of the output terminal of the gray voltage generation unit to the first terminal of the first capacitor in response to a second control signal; a third switch controlling a connection or disconnection of the second input terminal of the amplifier to the second terminal of the first capacitor in response to a third control signal; and a fourth switch controlling a connection or disconnection of the output terminal of the amplifier to the first terminal of the first capacitor in response to a fourth control signal. The second switching unit may comprise: a fifth switch controlling a connection or disconnection of the first input terminal of the amplifier to the second terminal of the second capacitor in response to a fifth control signal; a sixth switch controlling a connection or disconnection of the output terminal of the gray voltage generation unit to the first terminal of the second capacitor in response to a sixth control signal; a seventh switch controlling a connection or disconnection of the second input terminal of the amplifier to the second terminal of the second capacitor in response to a seventh control signal; and an eighth switch controlling a connection or disconnection of the output terminal of the amplifier to the first terminal of the second capacitor in response to an eighth control signal.

When the first sub sample and hold circuit samples the i-th gray voltage, the first switching unit may control the first switch and the second switch to be turned on, and control the third switch and the fourth switch to be turned off. When the second sub sample and hold circuit outputs the j-th gray voltage, the second switching unit may control the fifth switch and the sixth switch to be turned off, and control the seventh switch and the eighth switch to be turned on.

When the first sub sample and hold circuit concludes the sampling of the i-th gray voltage, the first switching unit may control the first switch to be turned off, and after may control the second switch to be turned off, the first switching unit may control the first switch to be turned on again. When the second sub sample and hold circuit concludes the output of the j-th gray voltage, the first switching unit may control the first switch to be turned off. When the first sub sample and hold circuit outputs the sampled i-th gray voltage, the first switching unit may control the third switch to be turned on, and may control the fourth switch to be turned on. When the second sub sample and hold circuit concludes the output of the j-th gray voltage, the second switching unit may control the seventh switch to be turned off, and may control the eighth switch to be turned off. When the first sub sample and hold circuit outputs the sampled i-th gray voltage and the second sub sample and hold circuit performs sampling, the second switching unit may control the fifth switch to be turned on, and may control the sixth switch to be turned on.

When the first sub sample and hold circuit outputs the i-th gray voltage, the first switching unit may control the first switch and the second switch to be turned off, and may control the third switch and the fourth switch to be turned on. When the second sub sample and hold circuit samples the j-th gray voltage, the second switching unit may control the fifth switch and the sixth switch to be turned on, and may control the seventh switch and the eighth switch to be turned off.

When the second sub sample and hold circuit concludes the sampling of the j-th gray voltage, the second switching unit may control the fifth switch to be turned off, and after may control the sixth switch to be turned off, the second switching unit may control the fifth switch to be turned on again. When the first sub sample and hold circuit concludes the output of the i-th gray voltage, the second switching unit may control the fifth switch to be turned off. When the second sub sample and hold circuit outputs the sampled j-th gray voltage, the second switching unit may control the eighth switch to be turned on after controlling the seventh switch to be turned on.

The comparison signal may have a first logic state when the input image data is identical to the gamma data, and have a second logic state when the input image data is not identical to the gamma data. The sample and hold circuit may be enabled when the comparison signal has a first logic state, and disabled when the comparison signal has a second logic state.

In one embodiment, the comparison unit includes first through m-th XNOR gates (where m denotes the number of bits of the input image data) performing XNOR operations on the input image data and the gamma data, and an AND gate performing an AND operation on output signals of the first through m-th XNOR gates so as to output a result of the AND operation as the comparison signal.

In one embodiment, the gray voltage generation unit includes a plurality of resistors serially connected to one another and generates the first through n-th gray voltages by dividing a voltage level using the plurality of resistors.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE EMBODIMENTS

Figure 3:
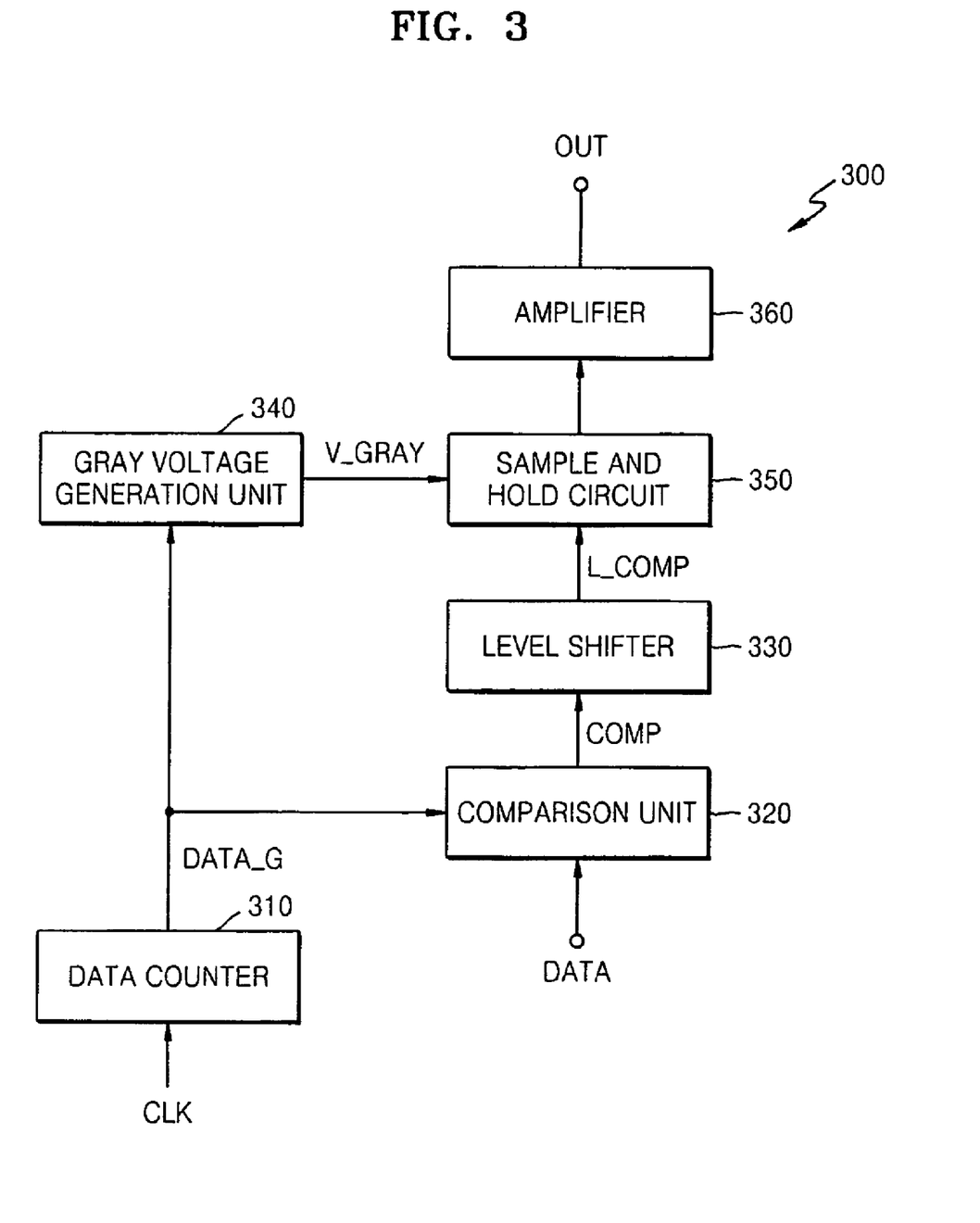
FIG. 3 is a block diagram of a display driver integrated circuit according to an embodiment of the present invention.

FIG. 3 is a block diagram of a display driver integrated circuit 300 according to an embodiment of the present invention. Referring to FIG. 3, the display driver integrated circuit 300 may include a data counter 310, a comparison unit 320, a gray voltage generation unit 340, and a sample and hold circuit 350. The display driver integrated circuit 300 may further include a level shifter 330 and an amplifier 360.

The data counter 310 outputs first through n-th gamma data (where n denotes a natural number) DATA_G in response to a clock signal CLK. An operation of the data counter 310 will be described below with reference to FIG. 4. The gray voltage generation unit 340 generates first through n-th gray voltages V_GRAY in response to the first through n-th gamma data DATA_G. An operation in which the gray voltage generation unit 340 generates the first through n-th gray voltages V_GRAY will be described below with reference to FIG. 5. The comparison unit 320 compares external input image data DATA with each of the first through n-th gamma data DATA_G and outputs a comparison signal COMP. Embodiments of the comparison unit 320 will be described below with reference to FIGS. 6A and 6B. The level shifter 330 receives the comparison signal COMP output by the comparison unit 320, changes the level of the comparison signal COMP to a voltage level suitable for the sample and hold circuit 350, and outputs a level-changed comparison signal L_COMP. The sample and hold circuit 350 outputs one of the first through n-th gray voltages V_GRAY to the amplifier 360 in response to the level-changed comparison signal L_COMP. The amplifier 360 amplifies a gray voltage output by the sample and hold circuit 350 and transmits the amplified gray voltage to an LCD panel (not shown). Operations and structures of the sample and hold circuit 350 and the amplifier 360 will be described below with reference to FIGS. 7 through 9.

Figure 4:
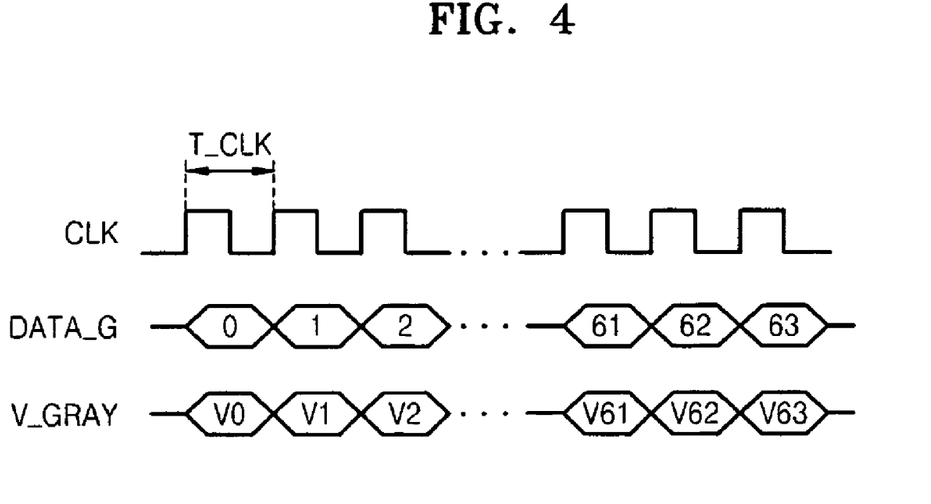
FIG. 4 is a waveform diagram of a clock signal, gamma data, and gray voltages used in the display driver integrated circuit illustrated in FIG. 3.

FIG. 4 is a waveform diagram of the clock signal CLK, the first through n-th gamma data DATA_G, and the first through n-th gray voltage V_GRAY.

Figure 5:
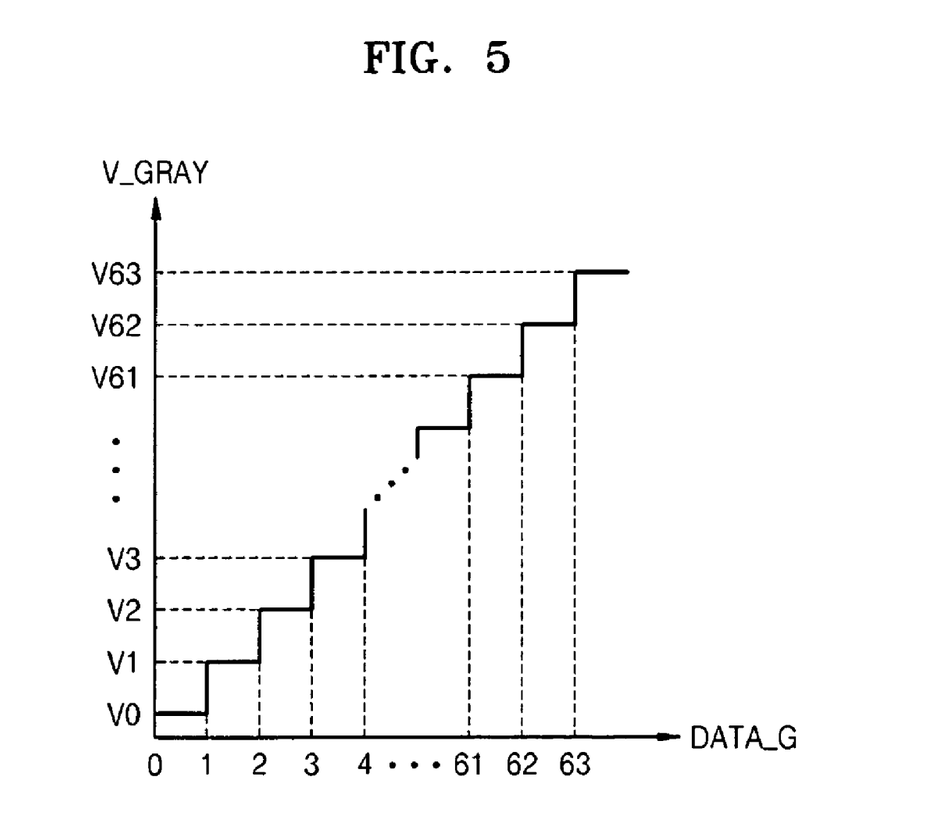
FIG. 5 is a graph for explaining a process in which the gray voltages illustrated in FIG. 4 are generated.

FIG. 5 is a graph illustrating a process in which the gray voltages V_GRAY are generated.

Referring to FIGS. 3 through 5, the data counter 310 outputs the gamma data DATA_G in response to the clock signal CLK. That is, FIG. 4 illustrates a case where the data counter 310 outputs one bit of the gamma data DATA_G during one cycle of the clock signal CLK and where first through sixty-fourth gamma data 0, 1, 2, through to 63 are output.

The gray voltage generation unit 340 outputs the gray voltages V_GRAY in response to the gamma data DATA_G. The gray voltage generation unit 340 outputs a first gray voltage V0 in response to the first gamma data 0 and a second gray voltage V1 in response to the second gamma data 1. Similarly, the gray voltage generation unit 340 outputs third through sixty-fourth gray voltages V2 through to V63 in response to the third through sixty-fourth gamma data 2 through to 63, respectively. The gray voltage generation unit 340 may include a plurality of resistors that are serially connected to one another. That is, the gray voltage generation unit 340 may generate the plurality of gray voltages as described above by distributing a voltage by using the serially connected resistors.

Figure 6A:
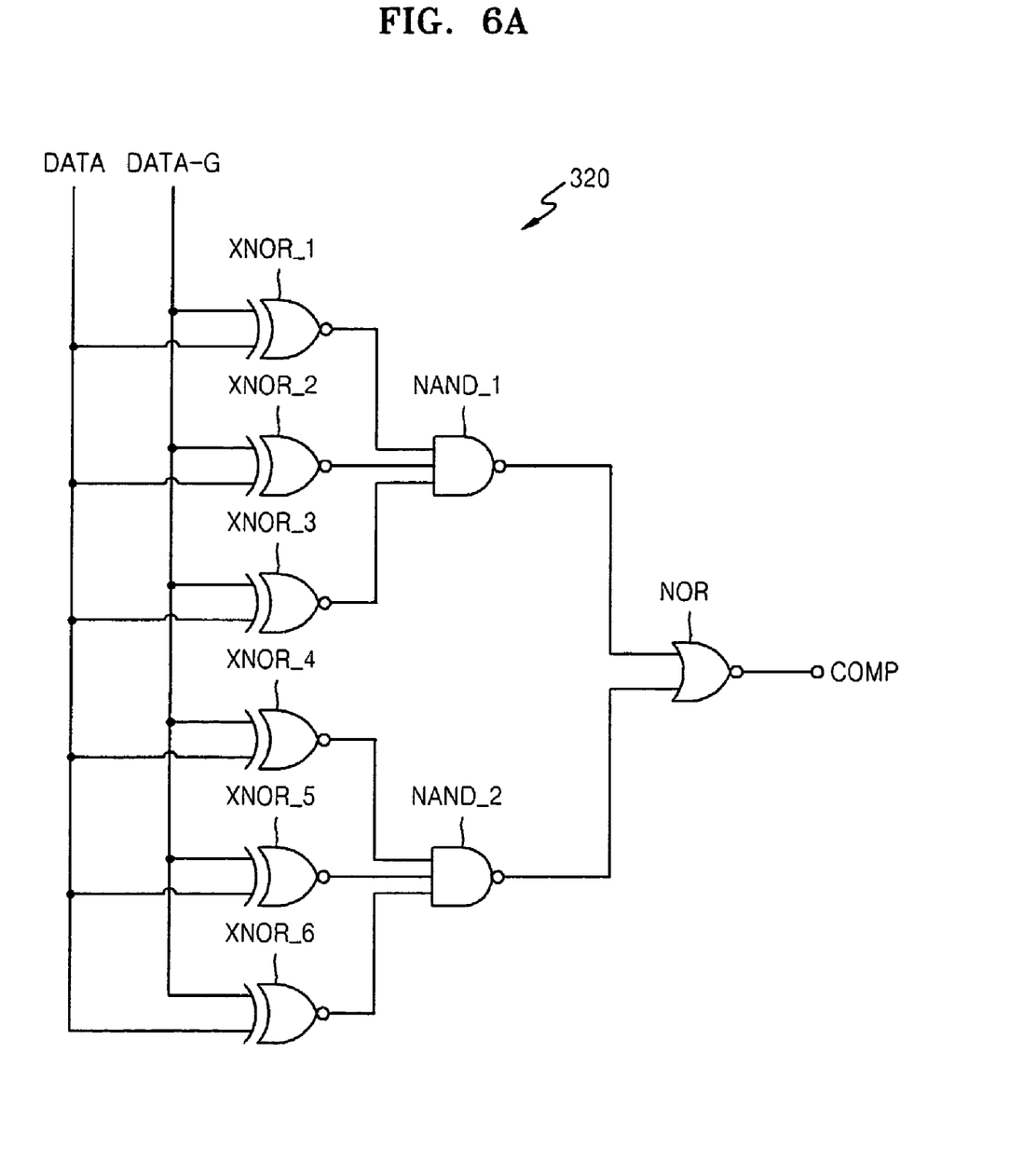
FIG. 6A is a circuit diagram of a comparison unit of the display driver integrated circuit illustrated in FIG. 3, according to an embodiment of the present invention.

In FIGS. 4 and 5, a case where the first through sixty-fourth gamma data 0,1, through to 63 are generated, and the first through sixty-fourth gray voltages V0, V1, through to V63 are generated in response to the first through sixty-fourth gamma data 0,1, through to 63 is illustrated. However, it will be apparent to one of ordinary skill in the art that the present invention is not limited to this case. FIG. 6A is a circuit diagram of an embodiment of the comparison unit 320 of the display driver integrated circuit 300.

Referring to FIGS. 3 and 6A, the comparison unit 320 according to the embodiment of FIG. 6A may include a plurality of XNOR gates XNOR_1, XNOR_2, through to XNOR_6, a plurality of NAND gates NAND_1 and NAND_2, and a NOR gate NOR. A case where 6-bit input image data DATA is compared with 6-bit gamma data DATA_G so as to generate the comparison signal COMP will now be described. However, it will be apparent to one of ordinary skill in the art that as long as comparison is performed in the same manner as described below while adjusting the number of gates even when input image data and gamma data each having a number of bits other than the number of bits in the aforementioned case are compared, the same effect as an effect of the present invention can be obtained.

The first XNOR gate XNOR_1 performs an XNOR operation on a first bit of the input image data DATA and a first bit of the gamma data DATA_G. If the first bit of the input image data DATA is the same as the first bit of the gamma data DATA_G, the first XNOR gate XNOR_1 outputs a signal in a first logic state. Otherwise, the first XNOR gate XNOR_1 outputs a signal in a second logic state. Hereinafter, the first logic state denotes a logic high state, and the second logic state denotes a logic low state. However, it will be apparent to one of ordinary skill in the art that the first logic state may denote a logic low state and the second logic state may denote a logic high state. The second XNOR gate XNOR_2 performs an XNOR operation on a second bit of the input image data DATA and a second bit of the gamma data DATA_G. Similarly, the third through sixth XNOR gates XNOR_3 through XNOR_6 perform XNOR operations on corresponding bits of the input image data DATA and corresponding bits of the gamma data DATA_G.

The first NAND gate NAND_1 performs a NAND operation on output signals of the first through third XNOR gates XNOR_1, XNOR_2, and XNOR_3. The second NAND gate NAND_2 performs a NAND operation on output signals of the fourth through sixth XNOR gates XNOR_4, XNOR_5, and XNOR_6. The NOR gate NOR performs a NOR operation on an output signal of the first NAND gate NAND_1 and an output signal of the second NAND gate NAND_2 and outputs the comparison signal COMP.

When these operations are performed and all of the bits of the 6-bit input image data DATA are the same as all of the bits of the 6-bit gamma data DATA_G, the comparison signal COMP has a first logic state. On the other hand, when any of the bits of the 6-bit input image data DATA is different from a corresponding bit of the bits of the 6-bit gamma data DATA_G, the comparison signal COMP has a second logic state.

Figure 6B:
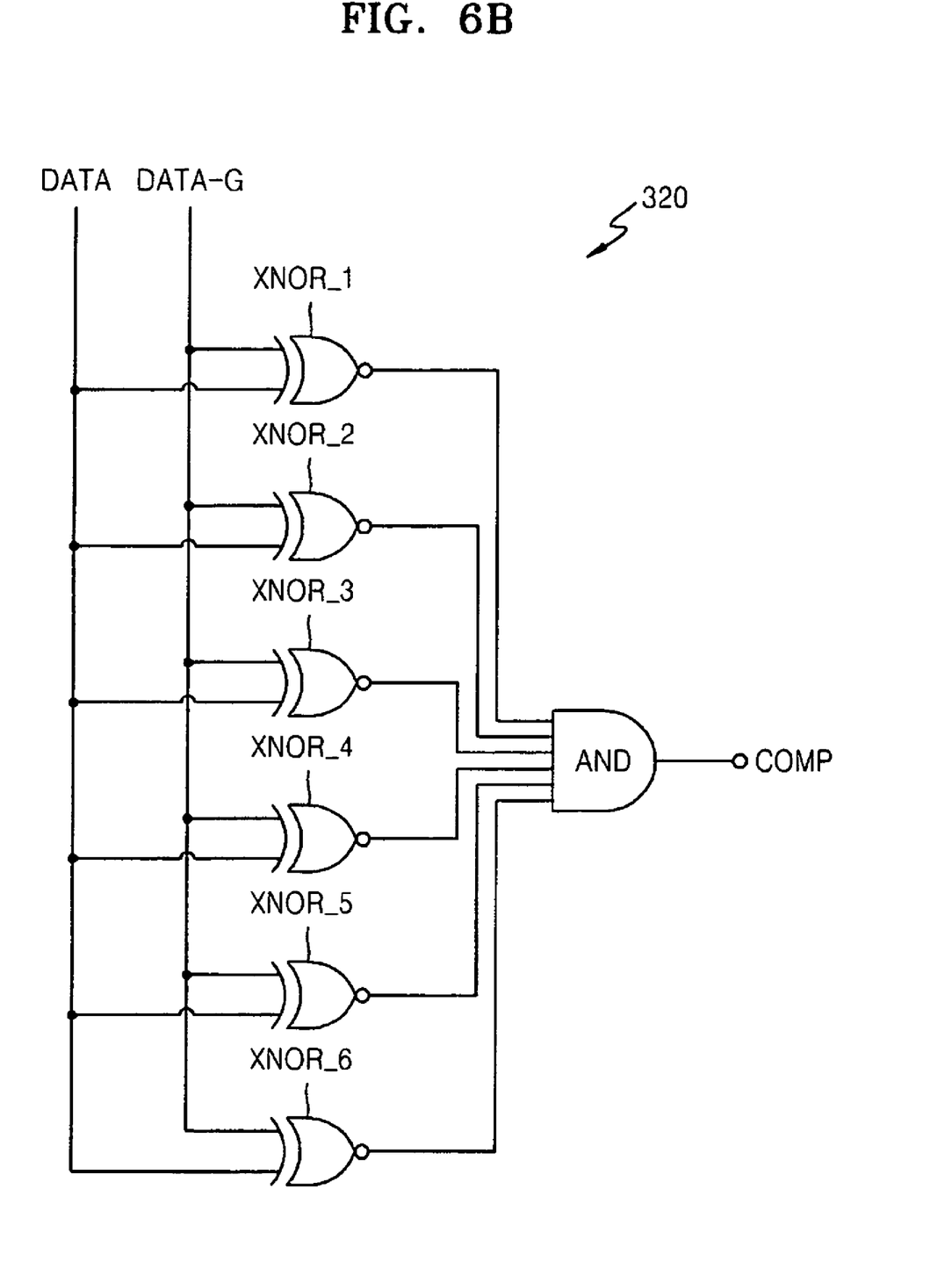
FIG. 6B is a circuit diagram of a comparison unit of the display driver integrated circuit illustrated in FIG. 3, according to another embodiment of the present invention.

FIG. 6B is a circuit diagram of another embodiment of the comparison unit 320 of the display driver integrated circuit 300.

Referring to FIGS. 3, 6A, and 6B, the comparison unit 320 of FIG. 3 may be implemented as the embodiment of FIG. 6B. That is, as illustrated in FIG. 6A, the comparison unit 320 of FIG. 6B may include the first through sixth XNOR gates XNOR_1, XNOR_2, through to XNOR_6. However, in contrast with FIG. 6A, the comparison unit 320 of FIG. 6B includes an AND gate AND. The AND gate performs an AND operation on output signals of the first through sixth XNOR gates XNOR_1, XNOR_2, through to XNOR_6 and outputs a result of the AND operation as the comparison signal COMP. Similar to FIG. 6A, when all of the bits of the 6-bit input image data DATA are the same as all of the bits of the 6-bit gamma data DATA_G, the comparison signal COMP has a first logic state. On the other hand, when any of the bits of the 6-bit input image data DATA is different from a corresponding bit of the bits of the 6-bit gamma data DATA_G, the comparison signal COMP has a second logic state.

The structure of the comparison unit 320 of FIG. 3 is not limited to the embodiments of FIGS. 6A and 6B. As long as the comparison signal COMP has a first logic state when all of the bits of the 6-bit input image data DATA are the same as all of the bits of the 6-bit gamma data DATA_G, and has a second logic state when any one of the bits of the 6-bit input image data DATA is different from a corresponding bit of the bits of the 6-bit gamma data DATA_G, an embodiment where other gates are used may be used as the comparison unit 320.

Figure 7:
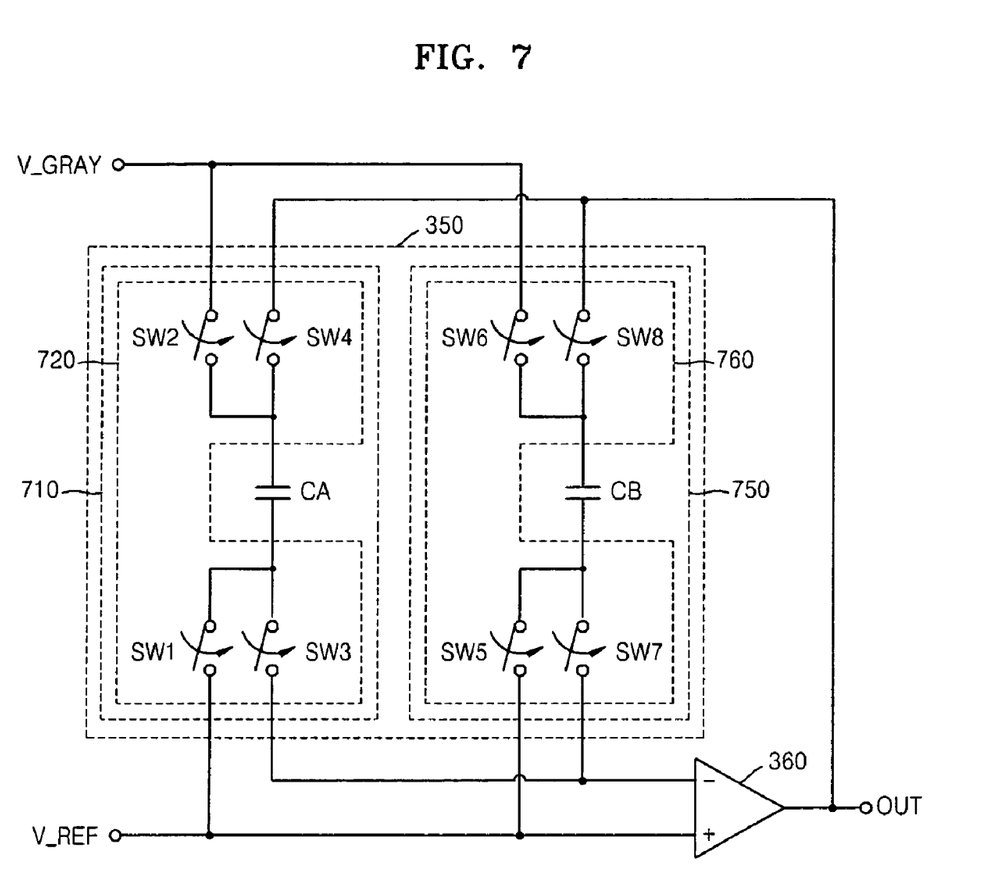
FIG. 7 is a circuit diagram of a sample and hold circuit and an amplifier of the display driver integrated circuit illustrated in FIG. 3.

FIG. 7 is a circuit diagram of the sample and hold circuit 350 and the amplifier 360 of the display driver integrated circuit 300.

Referring to FIGS. 3 and 7, the sample and hold circuit 350 may include a first sub sample and hold circuit 710 and a second sub sample and hold circuit 750. The sample and hold circuit 350 may be enabled or disabled in response to the comparison signal COMP. For example, when the comparison signal COMP is in a first logic state, that is, when input image data DATA comprised of a predetermined number of bits is completely the same as gamma data DATA_G comprised of the predetermined number of bits, the sample and hold circuit 350 is enabled. On the other hand, when the comparison signal COMP is in a second logic state, that is, when the input image data DATA comprised of a predetermined number of bits is not completely the same as the gamma data DATA_G comprised of the predetermined number of bits, the sample and hold circuit 350 is disabled.

The sample and hold circuit 350 operates as a ping-pong type. The ping-pong type sample and hold circuit 350 denotes a sample and hold circuit in which when the first sub sample and hold circuit 710 performs sampling, the second sub sample and hold circuit 750 performs holding, and when the second sub sample and hold circuit 750 performs sampling, the first sub sample and hold circuit 710 performs holding. The sampling denotes an operation of tracking a corresponding one of the gray voltages, and the holding denotes an operation of maintaining and outputting the sampled gray voltage.

The first sub sample and hold circuit 710 may include a first capacitor CA and a first switching unit 720. The first capacitor CA is charged to one of the gray voltages V_GRAY. The first switching unit 720 may include first through fourth switches SW1, SW2, SW3, and SW4. The first switch SW1 controls a connection or disconnection of a first input terminal (+) of the amplifier 360 with a second terminal of the first capacitor CA in response to a first control signal. A reference voltage V_REF is applied to the first input terminal (+) of the amplifier 360. The reference voltage V_REF may have a voltage level which is half that of a power supply voltage applied to the amplifier 360. The second switch SW2 controls a connection or disconnection of an output terminal of the gray voltage generation unit 340 with a first terminal of the first capacitor CA in response to a second control signal. The third switch SW3 controls a connection or disconnection of a second input terminal (−) of the amplifier 360 with the second terminal of the first capacitor CA in response to a third control signal. The fourth switch SW4 controls a connection or disconnection of an output terminal of the amplifier 360 with the first terminal of the first capacitor CA in response to a fourth control signal.

The second sub sample and hold circuit 750 may include a second capacitor CB and a second switching unit 760. The second capacitor CB is charged to one of the gray voltages V_GRAY. The second switching unit 760 may include fifth through eighth switches SW5, SW6, SW7, and SW8. The fifth switch SW5 controls a connection or disconnection of the first input terminal (+) of the amplifier 360 with a second terminal of the second capacitor CB in response to a fifth control signal. The sixth switch SW6 controls a connection or disconnection of the output terminal of the gray voltage generation unit 340 with a first terminal of the second capacitor CB in response to a sixth control signal. The seventh switch SW7 controls a connection or disconnection of the second input terminal (−) of the amplifier 360 with the second terminal of the second capacitor CB in response to a seventh control signal. The eighth switch SW8 controls a connection or disconnection of the output terminal of the amplifier 360 with the first terminal of the second capacitor CB in response to an eighth control signal.

Although not shown in FIG. 7, the first through eighth control signals are signals used to control on or off states of their corresponding switches. Hereinafter, it is assumed that when each of the control signals is in a first logic state, a corresponding switch is turned on, i.e., closed, and when each of the control signals is in a second logic state, the corresponding switch is turned off, i.e., open. However, it will be apparent to one of ordinary skill in the art that in the opposite case, i.e., when each switch is turned on (closed) or off (open) when a corresponding control signal is in a second or first logic state, respectively, the same effect as that of the present invention can be obtained.

The amplifier 360 may be implemented as a general operational amplifier OP_AMP that includes a first input terminal (+), a second input terminal (−), and an output terminal OUT.

Figure 8A:
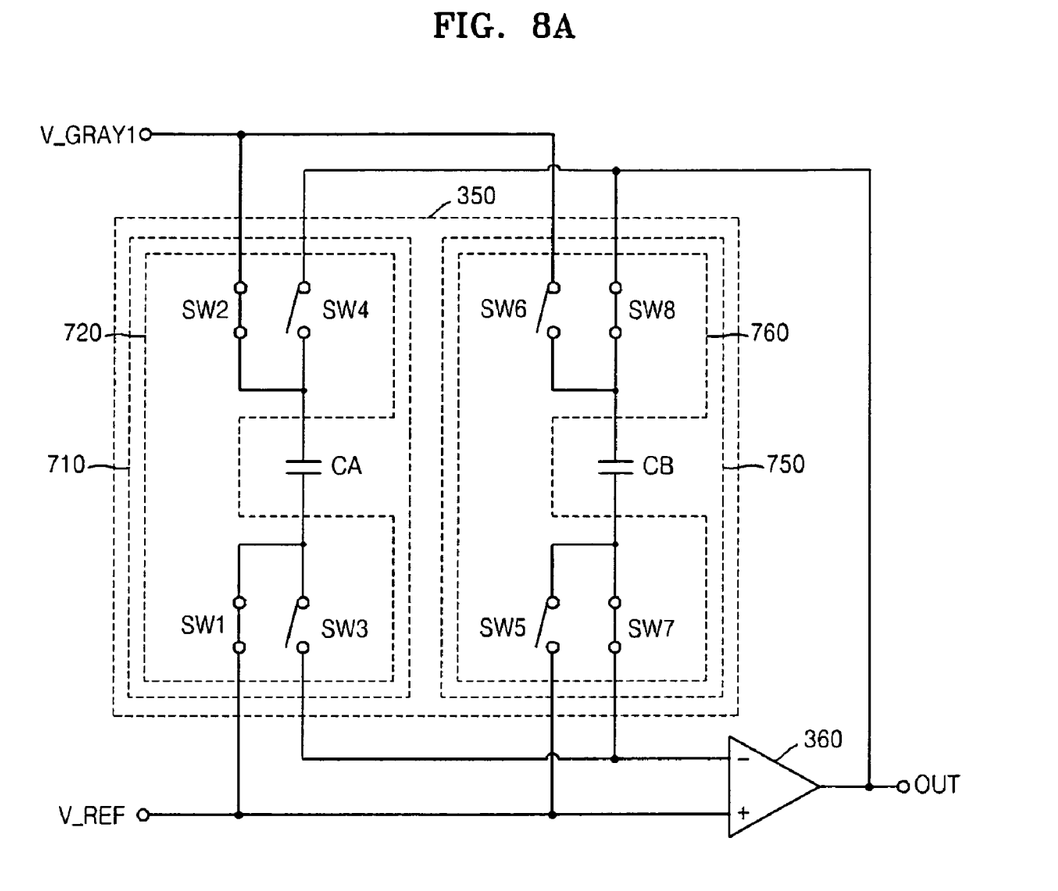
FIG. 8A is a circuit diagram of the sample and hold circuit and the amplifier of the display driver integrated circuit of FIG. 3, when a first sub sample and hold circuit performs sampling and a second sub sample and hold circuit performs holding.

FIG. 8A is a circuit diagram of the sample and hold circuit 350 and the amplifier 360 when the first sub sample and hold circuit 710 performs sampling and the second sub sample and hold circuit 750 performs holding.

Referring to FIGS. 3, 7, and 8A, the first sub sample and hold circuit 710 performs the sampling, and the second sub sample and hold circuit 750 performs the holding. For convenience of description, it is assumed that the first sub sample and hold circuit 710 samples a first gray voltage V_GRAY1 and the second sub sample and hold circuit 750 holds a second gray voltage (not shown) of the second capacitor CB. However, the present invention is not limited to this case. That is, when the first sub sample and hold circuit 710 samples an arbitrary gray voltage and the second sub sample and hold circuit 750 holds an arbitrary gray voltage of the second capacitor CB, the same effect as that of the present invention can still be obtained.

Since the first sub sample and hold circuit 710 performs sampling, the first switch SW1 is turned on in response to the first control signal and the second switch SW2 is also turned on in response to the second control signal. However, the third switch SW3 is turned off in response to the third control signal, and the fourth switch SW4 is also turned off in response to the fourth control signal. Accordingly, the first capacitor CA of the first sub sample and hold circuit 710 is charged to the first gray voltage V_GRAY1.

Since the second sub sample and hold circuit 750 performs holding, the fifth switch SW5 is turned off in response to the fifth control signal and the sixth switch SW6 is also turned off in response to the sixth control signal. However, the seventh switch SW7 is turned on in response to the seventh control signal, and the eighth switch SW8 is also turned on in response to the eighth control signal. Accordingly, the second sub sample and hold circuit 750 and the amplifier 360 amplify and output the second gray voltage of the second capacitor CB.

Figure 8B:
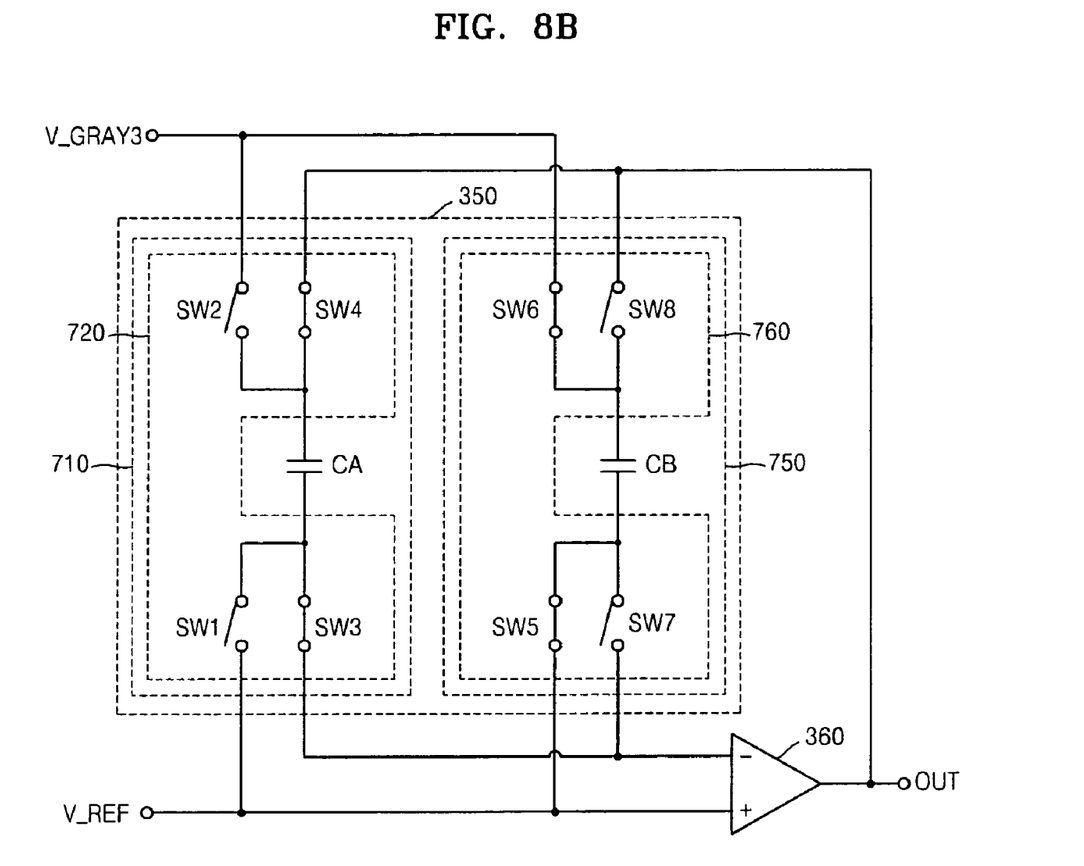
FIG. 8B is a circuit diagram of the sample and hold circuit and the amplifier of the display driver integrated circuit of FIG. 3, when the first sub sample and hold circuit performs holding and the second sub sample and hold circuit performs sampling.

FIG. 8B is a circuit diagram of the sample and hold circuit 350 and the amplifier 360 when the first sub sample and hold circuit 710 performs holding and the second sub sample and hold circuit 750 performs sampling.

Referring to FIGS. 3, 7, and 8B, the first sub sample and hold circuit 710 performs the holding, and the second sub sample and hold circuit 750 performs the sampling. For convenience of description, it is assumed that the first sub sample and hold circuit 710 holds the first gray voltage V_GRAY1 of the first capacitor CA as a result of the sampling of FIG. 8A and the second sub sample and hold circuit 750 samples a third gray voltage V_GRAY3.

Since the first sub sample and hold circuit 710 performs holding, the first switch SW1 is turned off in response to the first control signal and the second switch SW2 is also turned off in response to the second control signal. However, the third switch SW3 is turned on in response to the third control signal, and the fourth switch SW4 is also turned on in response to the fourth control signal. Accordingly, the first sub sample and hold circuit 710 and the amplifier 360 amplify and output the first gray voltage V_GRAY1 of the first capacitor CA.

Since the second sub sample and hold circuit 750 performs sampling, the fifth switch SW5 is turned on in response to the fifth control signal and the sixth switch SW6 is also turned on in response to the sixth control signal. However, the seventh switch SW7 is turned off in response to the seventh control signal, and the eighth switch SW8 is also turned off in response to the eighth control signal. Accordingly, the second capacitor CB of the second sub sample and hold circuit 750 is charged to the third gray voltage V_GRAY3.

As can be seen from FIGS. 8A and 8B, when the first sub sample and hold circuit 710 performs the sampling, the second sub sample and hold circuit 750 performs the holding. When the first sub sample and hold circuit 710 performs the holding, the second sub sample and hold circuit 750 performs the sampling. That is, the first sub sample and hold circuit 710 and the second sub sample and hold circuit 750 should not perform identical operations at the same time, for example, they should not both perform sampling simultaneously. Accordingly, cases where the second switch SW2 and the sixth switch SW6 are both turned on and the first switch SW1 and the fifth switch SW5 are both turned on do not happen. In addition, cases where the fourth switch SW4 and the eighth switch SW8 are both turned on and the third switch SW3 and the seventh switch SW7 are both turned on do not happen.

Figure 9:
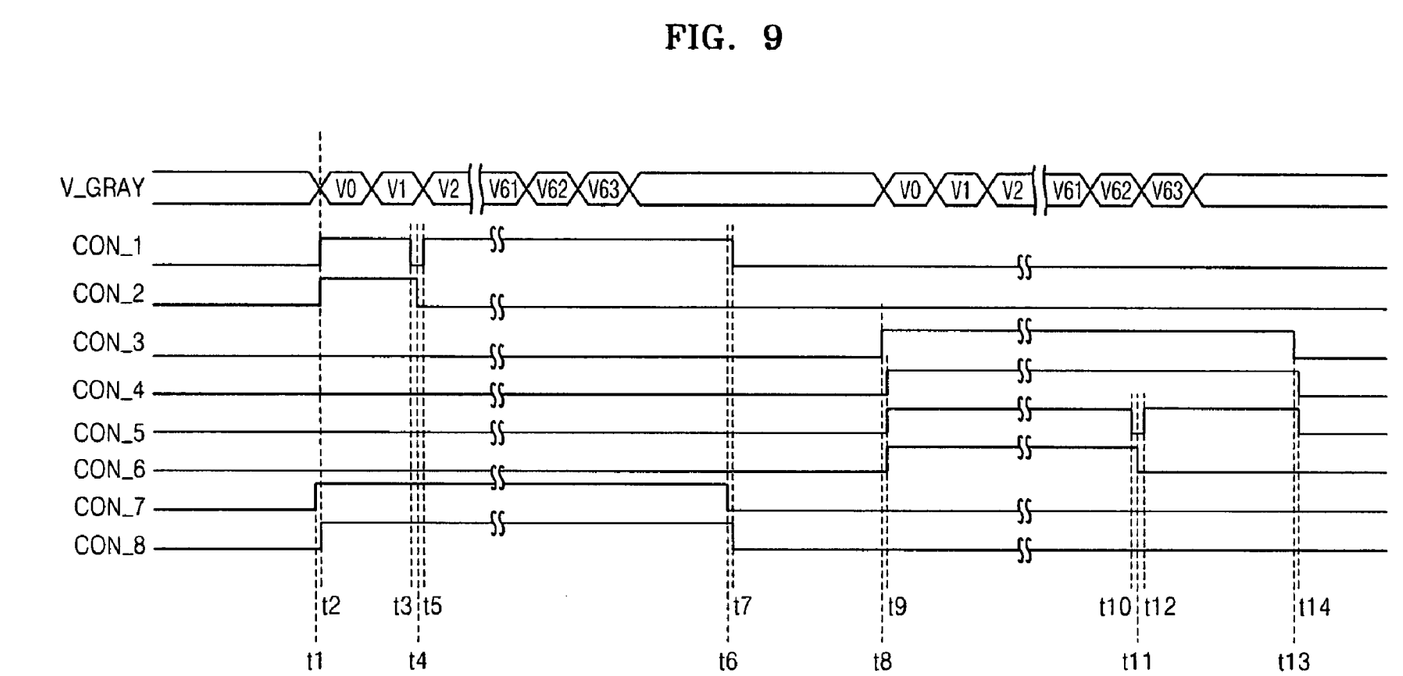
FIG. 9 is a waveform of gray voltages and first through eighth control signals used in the display driver integrated circuit illustrated in FIG. 3.

FIG. 9 is a waveform of the gray voltages V_GRAY and the first through eighth control signals.

Referring to FIGS. 7 through 9, during an interval from a point in time t1 to a point in time t7, the first sub sample and hold circuit 710 performs the sampling and the second sub sample and hold circuit 750 performs the holding. More specifically, at the point in time t1, while the seventh control signal CON_7 is changing from a second logic state to a first logic state, the seventh switch SW7 is turned on. Thereafter, at a point in time t2, while the first control signal CON_1, the second control signal CON_2, and the eighth control signal CON_8 are changing from a second logic state to a first logic state, the first switch SW1, the second switch SW2, and the eighth switch SW8 are turned on. Therefore, from the point in time t2, the first sub sample and hold circuit 710 starts the sampling and the second sub sample and hold circuit 750 starts the holding. The sampling of the first sub sample and hold circuit 710 has been completed at a third point in time t3. In this case, first, at the point in time t3, while the first control signal CON_1 is changing from a first logic state to a second logic state, the first switch SW1 is turned off. At a point in time t4, while the second control signal CON_2 is changing from a first logic state to a second logic state, the second switch SW2 is turned off. At a point in time t5, while the first control signal CON_1 is changing from a second logic state to a first logic state, the first switch SW1 is turned back on. Thereafter, at a point in time t6, while the seventh control signal CON_7 is changing from a first logic state to a second logic state, the seventh switch SW7 is turned off. At a point in time t7, while the first control signal CON_1 and the eighth control signal CON_8 are changing from a first logic state to a second logic state, the first switch SW1 and the eighth switch SW8 are turned off, and thus the holding of the second sub sample and hold circuit 750 is completed.

During an interval from a point in time t8 to a point in time t14, the first sub sample and hold circuit 710 performs the holding and the second sub sample and hold circuit 750 performs the sampling. In this case, during an interval from the point in time t7 to the point in time t8, an output terminal OUT (see FIG. 3) of the display driver integrated circuit 300 is reset. Thereafter, at the point in time t8, while the third control signal CON_3 is changing from a second logic state to a first logic state, the third switch SW3 is turned on. Thereafter, at a point in time t9, while the fourth control signal CON_4, the fifth control signal CON_5, and the sixth control signal CON_6 are changing from a second logic state to a first logic state, the fourth switch SW4, the fifth switch SW5, and the sixth switch SW6 are turned on. Therefore, from the point in time t9, the first sub sample and hold circuit 710 starts the holding and the second sub sample and hold circuit 750 starts the sampling. The sampling of the second sub sample and hold circuit 750 has been completed at a point in time t10. In this case, first, at the point in time t10, while the fifth control signal CON_5 is changing from a first logic state to a second logic state, the fifth switch SW5 is turned off. At a point in time t11, while the sixth control signal CON_6 is changing from a first logic state to a second logic state, the sixth switch SW6 is turned off. At a point in time t12, while the fifth control signal CON_5 is changing from a second logic state to a first logic state, the fifth switch SW5 is turned back on. Thereafter, at a point in time t13, while the third control signal CON_3 is changing from a first logic state to a second logic state, the third switch SW3 is turned off. At a point in time t14, while the fourth control signal CON_4 and the fifth control signal CON_5 are changing from a first logic state to a second logic state, the fourth switch SW4 and the fifth switch SW5 are turned off, and thus the holding of the first sub sample and hold circuit 710 is completed. As described above, by using a method of preventing the switches connected to both ends of either the first capacitor CA or the second capacitor CB from being simultaneously switched on, generation of noise during switching, for example, a charge injection error and a clock feed-through error, can be minimized.

A display driver integrated circuit using a ping-pong type sample and hold circuit according to the present invention can prevent an increase in the size of the display driver integrated circuit even when the number of bits of input image data is increased, secure a sufficient amount of sampling time, and minimize generation of a charge injection error and a clock feed-through error.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A display driver integrated circuit comprising:
a data counter outputting first through n-th gamma data in response to a clock signal;

a comparison unit comparing input image data with each of the first through n-th gamma data so as to output a comparison signal;

a gray voltage generation unit generating first through n-th gray voltages in response to the first through n-th gamma data; and a sample and hold circuit comprising a first sub sample and hold circuit and a second sub sample and hold circuit and outputting one of the first through n-th gray voltages in response to the comparison signal, wherein, while the first sub sample and hold circuit is performing sampling, the second sub sample and hold circuit outputs one of the first through n-th gray voltages, or while the second sub sample and hold circuit is performing sampling, the first sub sample and hold circuit outputs one of the first through n-th gray voltages, and wherein the comparison unit comprises first through m-th XNOR gates (where m denotes the number of bits of the input image data) performing XNOR operations on the input image data and the gamma data; and an AND gate performing an AND operation on output signals of the first through m-th XNOR gates so as to output a result of the AND operation as the comparison signal.

2. The display driver integrated circuit of claim 1, wherein:
the first sub sample and hold circuit comprises a first capacitor which is charged to an i-th gray voltage (where i is a natural number in the range of 1 to n); and
the second sub sample and hold circuit comprises a second capacitor which is charged to a j-th gray voltage (where j is a natural number in the range of 1 to n).

3. The display driver integrated circuit of claim 2, wherein while the first capacitor is charged to the i-th gray voltage, the sample and hold circuit outputs the j-th gray voltage of the second capacitor.

4. The display driver integrated circuit of claim 3, wherein:
the first capacitor comprises a first terminal to which the i-th gray voltage is applied and a second terminal to which a reference voltage is applied; and
the second capacitor comprises a first terminal to which an output terminal of the display driver integrated circuit is connected, and a second terminal to which the reference voltage is applied.

5. The display driver integrated circuit of claim 2, wherein, while the second capacitor is charged to the j-th gray voltage, the sample and hold circuit outputs the i-th gray voltage of the first capacitor.

6. The display driver integrated circuit of claim 5, wherein:
the second capacitor comprises a first terminal to which the j-th gray voltage is applied and a second terminal to which a reference voltage is applied; and
the first capacitor comprises a first terminal to which an output terminal of the display driver integrated circuit is connected, and a second terminal to which the reference voltage is applied.

7. The display driver integrated circuit of claim 2, further comprising an amplifier amplifying and outputting the gray voltage output by the sample and hold circuit.

8. The display driver integrated circuit of claim 7, wherein:
the first sub sample and hold circuit further comprises a first switching unit controlling a connection or disconnection of one of an output terminal of the gray voltage generation unit and an output terminal of the amplifier to a first terminal of the first capacitor and controlling a connection or disconnection of one of a first input terminal and a second input terminal of the amplifier to a second terminal of the first capacitor; and
the second sub sample and hold circuit further comprises a second switching unit controlling a connection or disconnection of one of the output terminal of the gray voltage generation unit and the output terminal of the amplifier to a first terminal of the second capacitor and controlling a connection or disconnection of one of the first input terminal and the second input terminal of the amplifier to a second terminal of the second capacitor.

9. The display driver integrated circuit of claim 8, wherein the first switching unit and the second switching unit control the first terminals of the first and second capacitors to be disconnected from each other, and control the second terminals of the first and second capacitors to be disconnected from each other.

10. The display driver integrated circuit of claim 8, wherein:
the first switching unit comprises:
a first switch controlling a connection or disconnection of the first input terminal of the amplifier to the second terminal of the first capacitor in response to a first control signal;
a second switch controlling a connection or disconnection of the output terminal of the gray voltage generation unit to the first terminal of the first capacitor in response to a second control signal;
a third switch controlling a connection or disconnection of the second input terminal of the amplifier to the second terminal of the first capacitor in response to a third control signal; and
a fourth switch controlling a connection or disconnection of the output terminal of the amplifier to the first terminal of the first capacitor in response to a fourth control signal; and
the second switching unit comprises:
a fifth switch controlling a connection or disconnection of the first input terminal of the amplifier to the second terminal of the second capacitor in response to a fifth control signal;
a sixth switch controlling a connection or disconnection of the output terminal of the gray voltage generation unit to the first terminal of the second capacitor in response to a sixth control signal;
a seventh switch controlling a connection or disconnection of the second input terminal of the amplifier to the second terminal of the second capacitor in response to a seventh control signal; and
an eighth switch controlling a connection or disconnection of the output terminal of the amplifier to the first terminal of the second capacitor in response to an eighth control signal.

11. The display driver integrated circuit of claim 10, wherein:
when the first sub sample and hold circuit samples the i-th gray voltage, the first switching unit controls the first switch and the second switch to be turned on, and controls the third switch and the fourth switch to be turned off; and
when the second sub sample and hold circuit outputs the j-th gray voltage, the second switching unit controls the fifth switch and the sixth switch to be turned off, and controls the seventh switch and the eighth switch to be turned on.

12. The display driver integrated circuit of claim 11, wherein:
when the first sub sample and hold circuit concludes the sampling of the i-th gray voltage, the first switching unit controls the first switch to be turned off, and after controls the second switch to be turned off, the first switching unit controls the first switch to be turned on again;
when the second sub sample and hold circuit concludes the output of the j-th gray voltage, the first switching unit controls the first switch to be turned off; and when the first sub sample and hold circuit outputs the sampled i-th gray voltage, the first switching unit controls the third switch to be turned on, and controls the fourth switch to be turned on.

13. The display driver integrated circuit of claim 12, wherein:
when the second sub sample and hold circuit concludes the output of the j-th gray voltage, the second switching unit controls the seventh switch to be turned off, and controls the eighth switch to be turned off; and
when the first sub sample and hold circuit outputs the sampled i-th gray voltage and the second sub sample and hold circuit performs sampling, the second switching unit controls the fifth switch to be turned on, and controls the sixth switch to be turned on.

14. The display driver integrated circuit of claim 10, wherein:
when the first sub sample and hold circuit outputs the i-th gray voltage, the first switching unit controls the first switch and the second switch to be turned off, and controls the third switch and the fourth switch to be turned on; and
when the second sub sample and hold circuit samples the j-th gray voltage, the second switching unit controls the fifth switch and the sixth switch to be turned on, and controls the seventh switch and the eighth switch to be turned off.

15. The display driver integrated circuit of claim 14, wherein:
when the second sub sample and hold circuit concludes the sampling of the j-th gray voltage, the second switching unit controls the fifth switch to be turned off, and after controls the sixth switch to be turned off, the second switching unit controls the fifth switch to be turned on again;
when the first sub sample and hold circuit concludes the output of the i-th gray voltage, the second switching unit controls the fifth switch to be turned off; and
when the second sub sample and hold circuit outputs the sampled j-th gray voltage, the second switching unit controls the eighth switch to be turned on after controls the seventh switch to be turned on.

16. The display driver integrated circuit of claim 15, wherein:
when the first sub sample and hold circuit concludes the output of the i-th gray voltage, the first switching unit controls the fourth switch to be turned off after controls the third switch to be turned off; and
when the second sub sample and hold circuit outputs the sampled j-th gray voltage and the first sub sample and hold circuit performs sampling, the first switching unit controls the first switch to be turned on, and controls the second switch to be turned on.

17. The display driver integrated circuit of claim 1, wherein:
the comparison signal has a first logic state when the input image data is identical to the gamma data, has a second logic state when the input image data is not identical to the gamma data; and
the sample and hold circuit is enabled when the comparison signal has a first logic state, and disabled when the comparison signal has a second logic state.

18. The display driver integrated circuit of claim 1, wherein the gray voltage generation unit comprises a plurality of resistors serially connected to one another and generates the first through n-th gray voltages by dividing a voltage level by using the plurality of resistors.

19. A display driver integrated circuit comprising: a data counter outputting first through n-th gamma data in response to a clock signal;
a comparison unit comparing input image data with each of the first through n-th gamma data so as to output a comparison signal;
a gray voltage generation unit generating first through n-th gray voltages in response to the first through n-th gamma data; and
a sample and hold circuit comprising a first sub sample and hold circuit and a second sub sample and hold circuit and outputting one of the first through n-th gray voltages in response to the comparison signal, wherein, while the first sub sample and hold circuit is performing sampling, the second sub sample and hold circuit outputs one of the first through n-th gray voltages, or while the second sub sample and hold circuit is performing sampling, the first sub sample and hold circuit outputs one of the first through n-th gray voltages, wherein the display driver integrated circuit further comprises an amplifier amplifying and outputting the gray voltage output by the sample and hold circuit,
wherein: the first sub sample and hold circuit comprises a first capacitor which is charged to an i-th gray voltage (where i is a natural number in the range of 1 to n); and the second sub sample and hold circuit comprises a second capacitor which is charged to a j-th gray voltage (where j is a natural number in the range of 1 to n), wherein: the first sub sample and hold circuit further comprises a first switching unit controlling a connection or disconnection of one of an output terminal of the gray voltage generation unit and an output terminal of the amplifier to a first terminal of the first capacitor and controlling a connection or disconnection of one of a first input terminal and a second input terminal of the amplifier to a second terminal of the first capacitor; and the second sub sample and hold circuit further comprises a second switching unit controlling a connection or disconnection of one of the output terminal of the gray voltage generation unit and the output terminal of the amplifier to a first terminal of the second capacitor and controlling a connection or disconnection of one of the first input terminal and the second input terminal of the amplifier to a second terminal of the second capacitor.

20. The display driver integrated circuit of claim 19, wherein the comparison unit comprises first through m-th XNOR gates (where m denotes the number of bits of the input image data) performing XNOR operations on the input image data and the gamma data; and
an AND gate performing an AND operation on output signals of the first through m-th XNOR gates so as to output a result of the AND operation as the comparison signal.

* * * * *